United States Patent
Araki et al.

(10) Patent No.: US 12,255,665 B2
(45) Date of Patent: Mar. 18, 2025

(54) SEMICONDUCTOR INTEGRATED CIRCUIT, RECEIVER DEVICE, AND RECEPTION METHOD

(71) Applicant: Kioxia Corporation, Tokyo (JP)

(72) Inventors: Mai Araki, Kawasaki Kanagawa (JP); Fumihiko Tachibana, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 192 days.

(21) Appl. No.: 17/942,743

(22) Filed: Sep. 12, 2022

(65) Prior Publication Data

US 2023/0299783 A1   Sep. 21, 2023

(30) Foreign Application Priority Data

Mar. 16, 2022   (JP) ................. 2022-041394

(51) Int. Cl.
| | |
|---|---|
| *H03M 1/10* | (2006.01) |
| *H03M 1/06* | (2006.01) |
| *H03M 1/08* | (2006.01) |
| *H03M 1/12* | (2006.01) |
| *H03M 1/18* | (2006.01) |

(Continued)

(52) U.S. Cl.
CPC ....... *H03M 1/1028* (2013.01); *H03M 1/0609* (2013.01); *H03M 1/0624* (2013.01); *H03M 1/0836* (2013.01); *H03M 1/181* (2013.01); *H03M 1/1215* (2013.01); *H04L 7/0025* (2013.01); *H04L 7/0062* (2013.01); *H04L 7/033* (2013.01)

(58) Field of Classification Search
CPC ............ H03M 1/1028; H03M 1/0609; H03M 1/0624; H03M 1/0836; H03M 1/181; H03M 1/1215; H04L 7/0025; H04L 7/0062; H04L 7/033
See application file for complete search history.

(56) References Cited

U.S. PATENT DOCUMENTS

| | | | |
|---|---|---|---|
| 7,283,074 B2* | 10/2007 | Sheng | ............ H04N 5/455 341/120 |
| 7,352,316 B2 | 4/2008 | Hori et al. | |
| 7,808,407 B2 | 10/2010 | Zimmerman et al. | |

(Continued)

FOREIGN PATENT DOCUMENTS

| | | |
|---|---|---|
| JP | 4774953 B2 | 9/2011 |
| JP | 4994315 B2 | 8/2012 |
| JP | 5095007 B2 | 12/2012 |

*Primary Examiner* — Khai M Nguyen
(74) *Attorney, Agent, or Firm* — Maier & Maier, PLLC

(57) ABSTRACT

According to one embodiment, a semiconductor integrated circuit includes a first converter, a second converter, and an adjustment circuit. The first converter is configured to sample an analog signal and convert the sampled analog signal to a first digital value based on a first clock signal. The second converter is configured to sample the analog signal and convert the sampled analog signal to a second digital value based on a second clock signal shifted a first phase from the first clock signal. The adjustment circuit is configured to adjust at least one of a gain of each of the first digital value and the second digital value and a phase of each of the first clock signal and the second clock signal based on the first digital value and the second digital value.

20 Claims, 8 Drawing Sheets

(51) Int. Cl.
*H04L 7/00* (2006.01)
*H04L 7/033* (2006.01)

(56) References Cited

U.S. PATENT DOCUMENTS

| | | | |
|---|---|---|---|
| 7,916,051 B1* | 3/2011 | Sestok | H03M 1/1061 |
| | | | 341/120 |
| 8,102,289 B2 | 1/2012 | Oshima et al. | |
| 9,013,339 B2* | 4/2015 | Payne | H03M 1/08 |
| | | | 341/123 |
| 9,270,291 B1* | 2/2016 | Parnaby | H04B 17/21 |

* cited by examiner

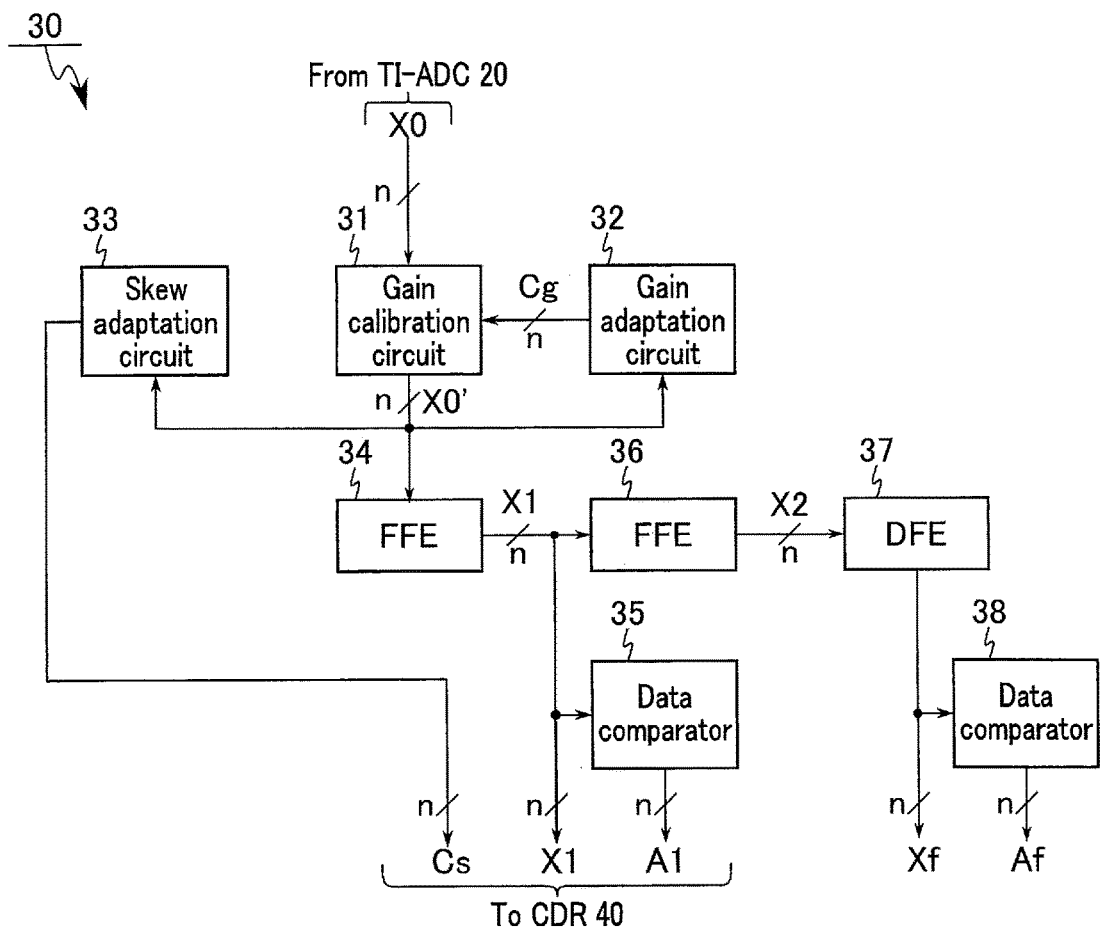
F I G. 4
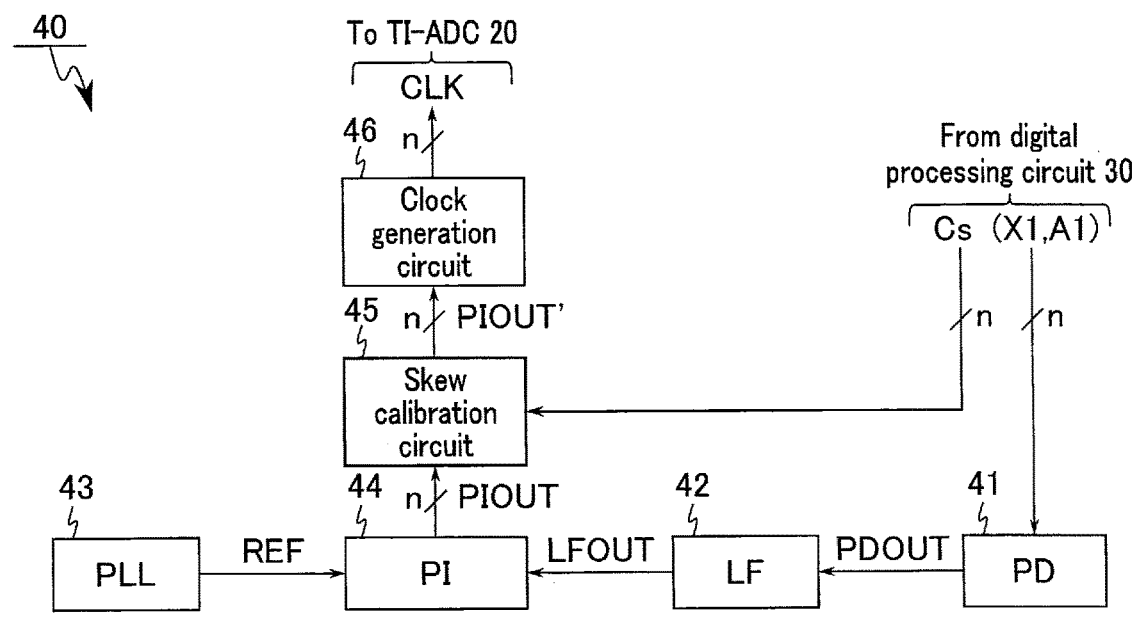
F I G. 5

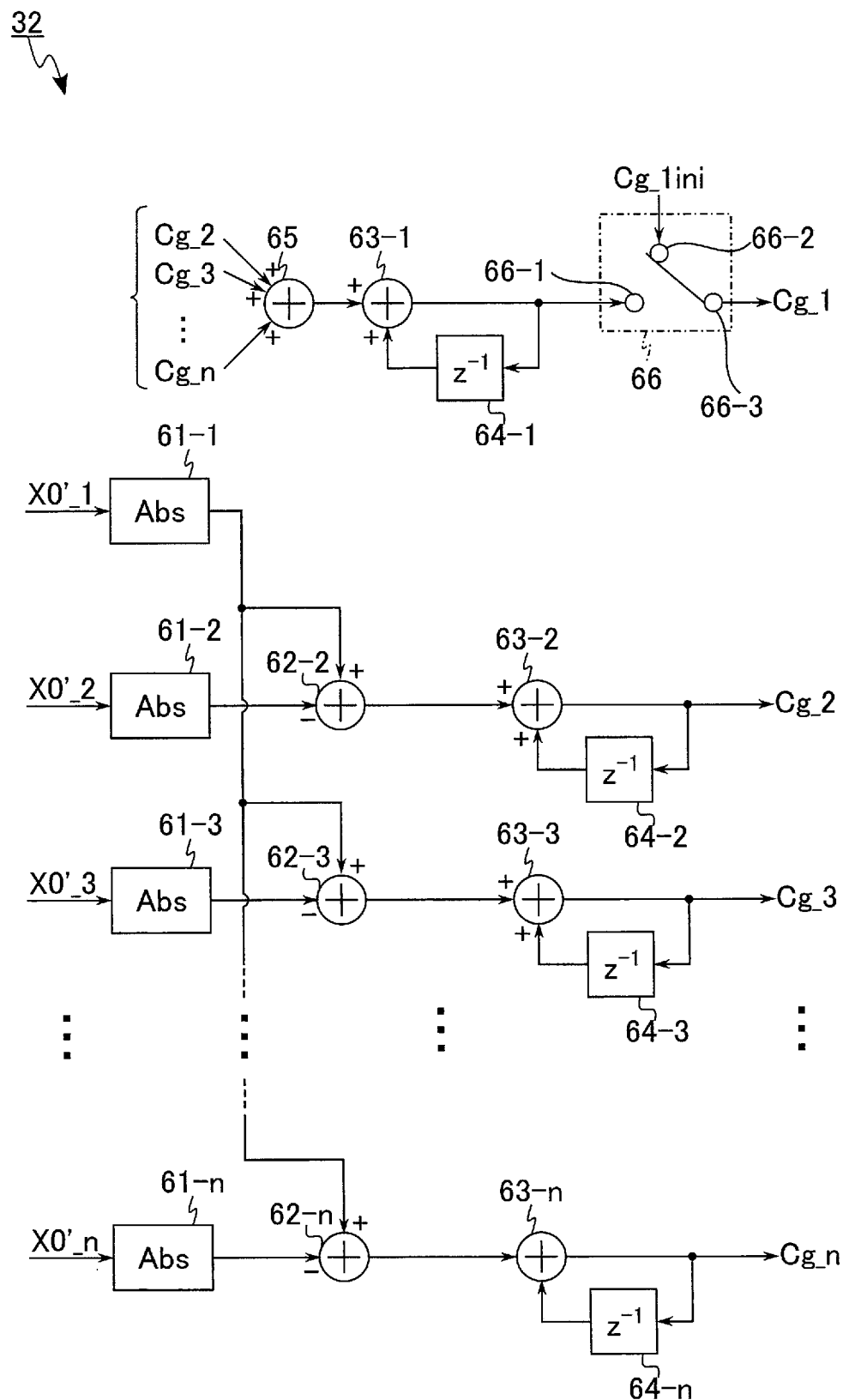
F I G. 7

SEMICONDUCTOR INTEGRATED CIRCUIT, RECEIVER DEVICE, AND RECEPTION METHOD

CROSS-REFERENCE TO RELATED APPLICATIONS

This application is based upon and claims the benefit of priority from Japanese Patent Application No. 2022-041394, filed Mar. 16, 2022, the entire contents of which are incorporated herein by reference.

FIELD

Embodiments described herein relate generally to a semiconductor integrated semiconductor circuit, a receiver device, and a reception method.

BACKGROUND

A transmitter device and a receiver device are connected via a transmission path. The receiver device receives a signal having passed through the transmission path. The receiver device includes a semiconductor integrated circuit that processes the received signal. The receiver device recovers a clock signal based on the received signal. The receiver device recovers data from the received signal based on the recovered clock signal.

BRIEF DESCRIPTION OF THE DRAWINGS

FIG. 4 is a block diagram illustrating an example of a configuration of a digital processing circuit of the receiver circuit according to the embodiment.

FIG. 5 is a block diagram illustrating an example of a configuration of a clock data recovery circuit of the receiver circuit according to the embodiment.

FIG. 7 is a block diagram illustrating an example of a configuration of a gain adaptation circuit of the digital processing circuit according to the embodiment.

DETAILED DESCRIPTION

In general, according to one embodiment, a semiconductor integrated circuit includes a first converter, a second converter, and an adjustment circuit. The first converter is configured to sample an analog signal and convert the sampled analog signal to a first digital value based on a first clock signal. The second converter is configured to sample the analog signal and convert the sampled analog signal to a second digital value based on a second clock signal shifted a first phase from the first clock signal. The adjustment circuit is configured to adjust at least one of a gain of each of the first digital value and the second digital value and a phase of each of the first clock signal and the second clock signal based on the first digital value and the second digital value.

Hereinafter, embodiments will be described with reference to the drawings.

Note that in the following description, components having substantially the same functions and configurations are denoted by the same reference signs. In a case where elements having similar configurations are particularly distinguished from each other, different characters or numbers may be added to the end of the same reference sign.

1. Configuration

A configuration according to an embodiment will be described.

1.1 Information Processing System

Figure 1:
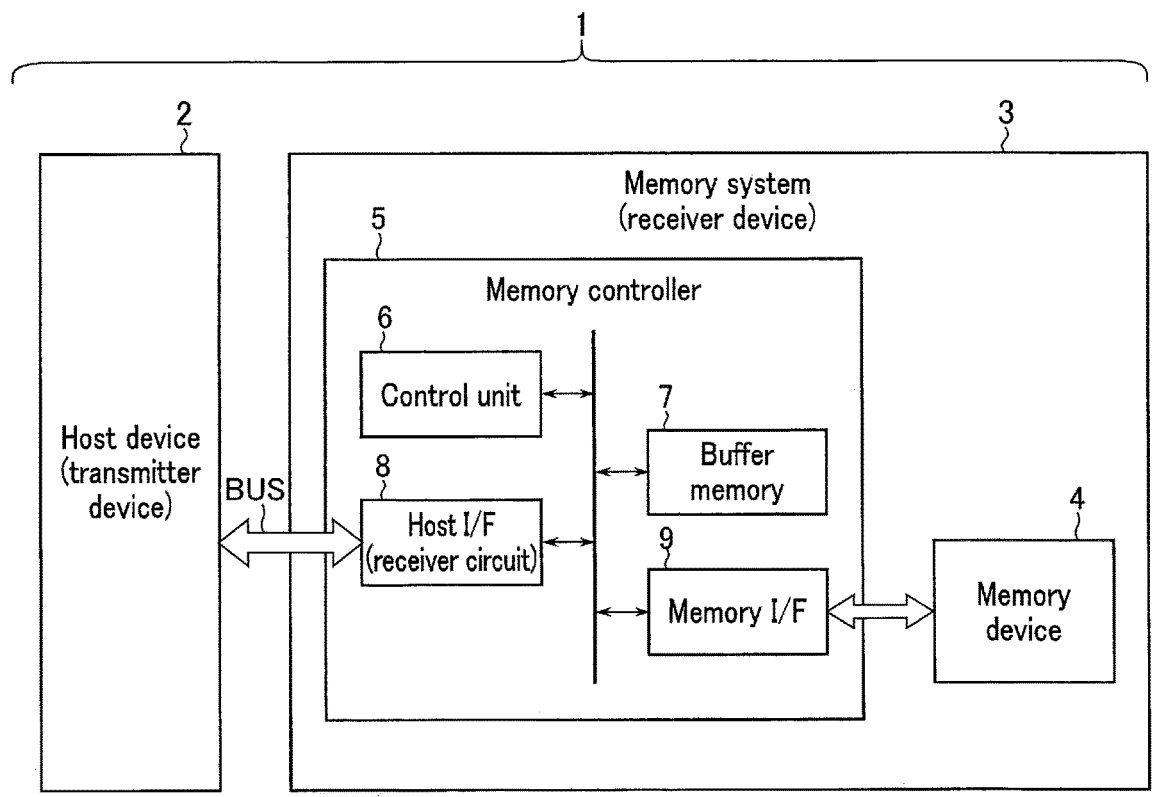
FIG. 1 is a block diagram illustrating an example of a configuration of an information processing system including a receiver device according to an embodiment.

First, a configuration of an information processing system including a receiver device according to the embodiment will be described. FIG. 1 is a block diagram illustrating an example of the configuration of the information processing system including the receiver device according to the embodiment.

The information processing system 1 is a system that transmits information by serial communication. The information processing system 1 includes a host device 2 and a memory system 3. The memory system 3 is configured to be connected to the host device 2 via a host bus BUS.

The host device 2 is an information processing apparatus outside the memory system 3. The host device 2 is, for example, a personal computer or a server installed in a data center. The host device 2 transmits various requests to the memory system 3. When transmitting a request to the memory system 3, the host device 2 functions as a transmitter device.

The memory system 3 is a storage device. The memory system 3 is, for example, a universal flash storage (UFS) device, a solid state drive (SSD), or a memory card such as an SD™ card. The memory system 3 executes a write operation, a read operation, and an erase operation of data in response to a request from the host device 2. When receiving a request from the host device 2, the memory system 3 functions as a receiver device.

1.2 Memory System

An internal configuration of the memory system according to the first embodiment will be described.

The memory system 3 includes a memory device 4 and a memory controller 5.

The memory device 4 is, for example, a nonvolatile memory. The memory device 4 is, for example, a NAND flash memory. The memory device 4 stores data in a nonvolatile manner.

The memory controller 5 includes, for example, an integrated circuit such as a system-on-a-chip (SoC). The memory controller 5 controls the memory device 4 based on a request from the host device 2. Specifically, for example, the memory controller 5 writes write data to the memory device 4 based on a write request from the host device 2. Further, the memory controller 5 reads read data from the memory device 4 based on a read request from the host device 2. Then, the memory controller 5 transmits the read data to the host device 2.

Next, an internal configuration of the memory controller 5 will be described. The memory controller 5 includes a control unit 6, a buffer memory 7, a host interface circuit (host I/F) 8, and a memory interface circuit (memory I/F) 9. A function of the memory controller 5 described below can be realized by either a hardware configuration or a combination configuration of hardware resources and firmware.

The control unit 6 is a circuit that controls the entire memory controller 5. The control unit 6 includes, for example, a processor such as a central processing unit (CPU), and a read only memory (ROM).

The buffer memory 7 is, for example, a static random access memory (SRAM). The buffer memory 7 buffers data transmitted between the host device 2 and the memory device 4. The buffer memory 7 temporarily stores the write data and the read data.

The host interface circuit 8 is a semiconductor integrated circuit. The host interface circuit 8 manages communication between the memory controller 5 and the host device 2. When receiving a request from the host device 2, some circuits of the host interface circuit 8 function as a receiver circuit. The host interface circuit 8 is connected to the host device 2 via the host bus BUS. The host bus BUS conforms to, for example, a peripheral component interconnect express (PCIe™), a mobile industry processor interface (MIPI), a serial attached (small computer system interface (SCSI) SAS), a serial (advanced technology attachment (ATA) SATA), or an SD™ interface.

The memory interface circuit 9 is a semiconductor integrated circuit. The memory interface circuit 9 manages communication between the memory device 4 and the memory controller 5. The memory interface circuit 9 is connected to the memory device 4 via a memory bus. The memory bus conforms to, for example, a single data rate (SDR) interface, a toggle double data rate (DDR) interface, or an open NAND flash interface (ONFI).

1.3 Host Interface Circuit (Receiver Circuit)

Figure 2:
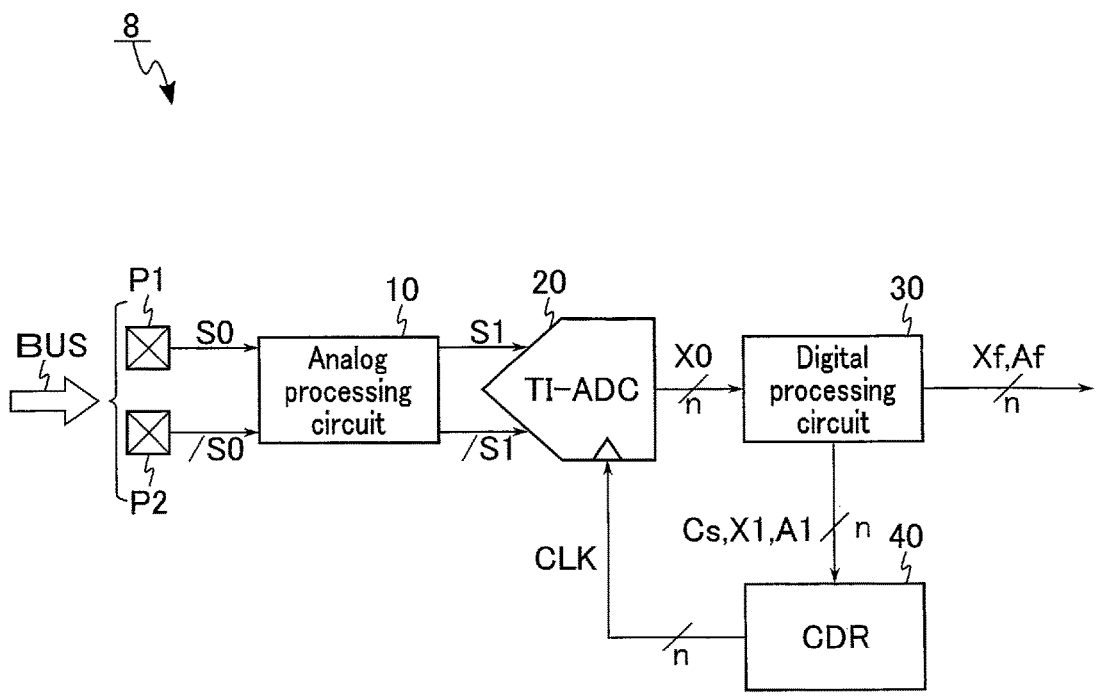
FIG. 2 is a block diagram illustrating an example of a configuration of a receiver circuit according to an embodiment.

Next, an internal configuration of a part corresponding to the receiver circuit included in the host interface circuit according to the embodiment will be described. FIG. 2 is a block diagram illustrating an example of a configuration of the receiver circuit of the receiver device according to the embodiment;

The host interface circuit 8 includes pads P1 and P2, an analog processing circuit 10, a TI-ADC 20, a digital processing circuit 30, and a CDR 40.

Each of the pads P1 and P2 is a terminal connected to the host bus BUS. In the example of FIG. 2, a case where the pads P1 and P2 receive signals S0 and /S0, respectively, from the host device 2 via the host bus BUS is illustrated.

The signals S0 and /S0 are differential signals. Before passing through the host bus BUS, the signals S0 and /S0 are, for example, pulse signals. Data from the host device 2 is modulated to each pulse of the signals S0 and /S0. A voltage level of each pulse of the signals S0 and /S0 corresponds to data of one or more bits. In the following description, it is assumed that 2-bit data is modulated for one pulse. Such a data transmission scheme is also referred to as a four-level pulse amplitude modulation (PAM4).

By passing through the host bus BUS, the signals S0 and /S0 receive a loss due to transmission characteristics (for example, frequency characteristics) of the host bus BUS. As a result, inter-symbol interference (ISI) occurs in the signals S0 and /S0 that have passed through the host bus BUS.

Therefore, the signals S0 and /S0 that have passed through the host bus BUS are processed as analog signals.

The analog processing circuit 10 is an analog front end (AFE). The analog processing circuit 10 includes, for example, a continuous time linear equalizer (CTLE) and a variable gain amplifier (VGA). The CTLE is an amplifier circuit having frequency characteristics that compensate for frequency characteristics of the host bus BUS. The VGA is an amplifier circuit capable of changing a gain. The signals S0 and /S0 are input to the analog processing circuit 10 from the pads P1 and P2, respectively. The analog processing circuit 10 executes analog processing on the signals S0 and /S0 using the CTLE and the VGA. The analog processing circuit 10 generates signals S1 and /S1 based on the signals S0 and /S0. The analog processing circuit 10 outputs the signals S1 and /S1 to the TI-ADC 20.

The TI-ADC 20 is a time-interleaved AD converter. The signals S1 and /S1 are input from the analog processing circuit 10 to the TI-ADC 20, and a signal CLK is input from the CDR 40 to the TI-ADC 20. The TI-ADC 20 converts the signals S1 and /S1 into a signal X0 based on the signal CLK. The TI-ADC 20 outputs the signal X0 to the digital processing circuit 30.

The signal CLK includes n clock signals. n is an integer of 1 or more (for example, 32). The n clock signals of the signal CLK have phases different by, for example, at least 360°/n. Hereinafter, the n clock signals in the signal CLK may be distinguished and shown as signals CLK_1, . . . , and CLK_n. A frequency of the signal CLK may be equal to a frequency of a clock signal embedded in the signals S0 and /S0 by the host device 2. The frequency of the signal CLK may be different from the frequency of the clock signal embedded in the signals S0 and /S0 by the host device 2.

The signal X0 is a digital signal. The signal X0 includes a plurality of consecutive digital values. A value of a bit of one digital value included in the signal X0 is sampled from one symbol of the signals S1 and /S1 based on one clock signal of the signal CLK. The one digital value is, for example, 7-bit data. A value of each bit of the n consecutive digital values included in the signal X0 is sampled from n consecutive symbols of the signals S1 and /S1 based on the n clock signals of the signal CLK. Hereinafter, a conversion cycle of the n consecutive digital values included in the signal X0 by the TI-ADC 20 is also simply referred to as a "cycle". Further, the n consecutive digital values included in the signal X0 are also referred to as "signals X0 for one cycle". Furthermore, the n consecutive digital values included in the signal X0 may be distinguished and shown as values X0_1, . . . , and X0_n.

The digital processing circuit 30 includes, for example, a feed forward equalizer (FFE), a decision feedback equalizer (DFE), and a data comparator. The configuration of the digital processing circuit 30 will be described later. The signal X0 is input to the digital processing circuit 30. The digital processing circuit 30 executes digital processing on the signal X0 using the FFE, the DFE, and the data comparator. Specifically, the digital processing circuit 30 generates signals X1 and Xf and data A1 and Af based on the signal. X0. The digital processing circuit 30 outputs the signal X1 and the data A1 to the CDR 40. The digital processing circuit 30 outputs the signal Xf and the data Af to a subsequent circuit (not illustrated). Details of generation of the signals X1 and Xf and the data A1 and Af will be described later.

The CDR 40 is a clock data recovery circuit. The signal X1 and the data A1 are input to the CDR 40 at every cycle. The CDR 40 calculates a correction amount of a phase of the signal CLK based on the signal X1 and the data A1. The CDR 40 recovers the signal CLK based on the calculated correction amount of the phase. The CDR 40 outputs the recovered signal CLK to the TI-ADC 20 at every cycle. In this manner, the CDR 40 recovers the signal CLK serving as a reference of the sampling timing of the subsequent signal X0 of one cycle based on the signal X1 and the data A1 generated from the signal X0 of one cycle. Such cyclical processing for each cycle by the TI-ADC 20, the digital processing circuit 30, and the CDR 40 is also referred to as a "CDR loop".

1.4 AD Converter

Figure 3:
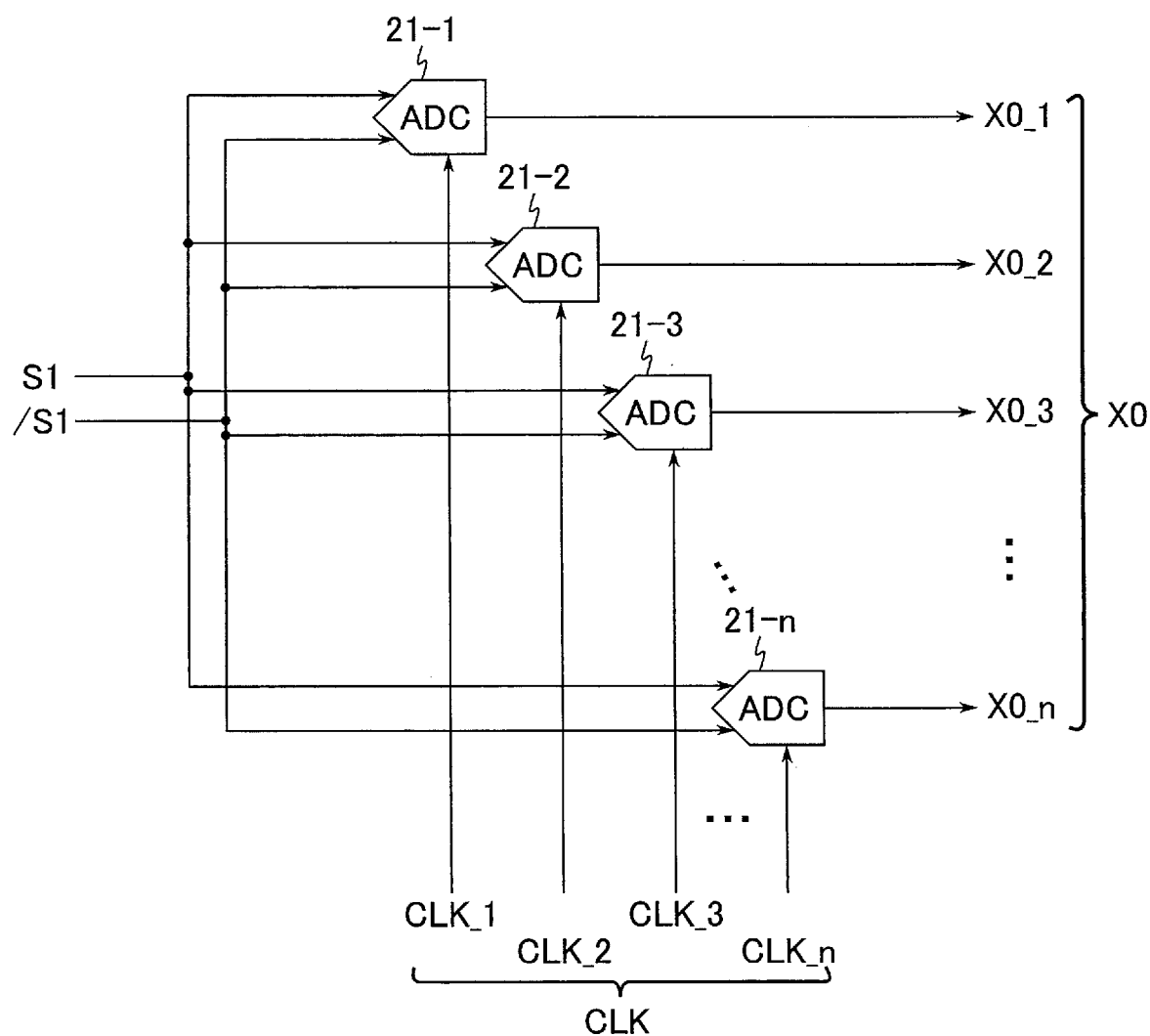
FIG. 3 is a block diagram illustrating an example of a configuration of an AD converter of the receiver circuit according to the embodiment.

Next, an internal configuration of the AD converter (TI-ADC) of the receiver circuit according to the embodiment will be described. FIG. 3 is a block diagram illustrating an example of the configuration of the AD converter of the receiver circuit according to the embodiment.

The TI-ADC 20 includes a plurality of ADCs 21. The plurality of ADCs 21 includes n ADCs 21-1, 21-2, 21-3, ..., 21-n. Each of the n ADCs 21-1 to 21-n is an AD converter that converts an analog signal into a digital signal.

The signals S1 and /S1 are commonly input to the n ADCs 21-1 to 21-n. Further, the signals CLK_1 to CLK_n are input to the n ADCs 21-1 to 21-n, respectively. The n ADCs 21-1 to 21-n sample the signals S1 and /S1 and convert the sampled analog signals S1 and /S1 to the values X0_1 to X0_n based on the signals CLK_1 to CLK_n, respectively. In this manner, the n consecutive digital values X0_1 to X0_n included in the signal X0 are sampled by the different ADCs 21-1 to 21-n, respectively.

The n ADCs 21-1 to 21-n may have different conversion characteristics, respectively. Specifically, for example, a minute deviation may occur in the sample timing of the signal CLK in each of the n ADCs 21-1 to 21-n. The minute deviation of the sample timing is also referred to as skew. Further, for example, a minute deviation may occur in gains of the values X0_1 to X0_n output from the n ADCs 21-1 to 21-n, respectively. This minute deviation of the gains is also referred to as a gain mismatch.

Therefore, in the subsequent digital processing circuit 30 and the CDR 40, adjustment of a difference in gain occurring in the values X0_1 to X0_n and adjustment of the phase of the signal CLK for correcting skew occurring in the TI-ADC 20 are executed.

1.5 Digital Processing Circuit

Next, an internal configuration of the digital processing circuit of the receiver circuit according to the embodiment will be described. FIG. 4 is a block diagram illustrating an example of the configuration of the digital processing circuit of the receiver circuit according to the embodiment.

The digital processing circuit 30 includes a gain calibration circuit 31, a gain adaptation circuit 32, a skew adaptation circuit 33, an FFE 34, a data comparator 35, an FFE 36, a DFE 37, and a data comparator 38.

The signal X0 is input to the gain calibration circuit 31. The gain calibration circuit 31 executes gain calibration processing for every n digital values included in the signal X0 for one cycle. A gain calibration code Cg input from the gain adaptation circuit 32 is used for the gain calibration processing by the gain calibration circuit 31. The gain calibration code Cg is a set of n digital values (codes) corresponding to the n digital values included in the signal X0 for one cycle. As a result of the gain calibration processing, the gain calibration circuit 31 generates a signal X0' in which a gain of the signal X0 is adjusted according to the gain calibration code Cg. That is, the signal X0' is a digital signal similarly to the signal X0. The signal X0' for one cycle is a set of n digital values. For example, in a case where the gain calibration code Cg is positive, the gain calibration circuit 31 generates the signal X0' such that the gain decreases. Further, for example, in a case where the gain calibration code Cg is negative, the gain calibration circuit 31 generates the signal X0' so that the gain increases. The gain calibration circuit 31 outputs the signal X0' to the gain adaptation circuit 32 and the skew adaptation circuit 33. The signal X0' is further output to the FFE 34.

The signal X0' is input to the gain adaptation circuit 32. The gain adaptation circuit 32 generates the gain calibration code Cg based on the n digital values included in the signal X0' for one cycle. The gain calibration code Cg generated by the gain adaptation circuit 32 is output to the gain calibration circuit 31.

Note that the gain adaptation circuit 32 updates the gain calibration code Cg by, for example, two types of gain update processing.

In the first type of gain update processing, the gain adaptation circuit 32 regards one digital value among the n digital values included in the signal X0' for one cycle as a reference value. Then, the gain adaptation circuit 32 updates (n−1) codes excluding one code corresponding to the reference value among the n codes included in the gain calibration code Cg. At this time, the gain adaptation circuit 32 does not update the one code corresponding to the reference value among the n codes included in the gain calibration code Cg.

In the second type of gain update processing, the gain adaptation circuit 32 first updates the (n−1) codes excluding the one code corresponding to the reference value among the n codes included in the gain calibration code Cg. Then, the gain adaptation circuit 32 further updates the one code corresponding to the reference value based on the updated (n−1) codes.

The signal X0' is input to the skew adaptation circuit 33. The skew adaptation circuit 33 generates a skew calibration code Cs based on the n digital values included in the signal X0' for one cycle. The skew calibration code Cs is a set of n digital values (codes) corresponding to the n clock signals included in the signal CLK for one cycle. The skew calibration code Cs generated by the skew adaptation circuit 33 is output to the CDR 40.

Note that the skew adaptation circuit 33 generates the skew calibration code Cs by, for example, two types of skew update processing.

In the first type of skew update processing, the skew adaptation circuit 33 regards one digital value among the n digital values included in the signal X0' for one cycle as a reference value. Then, the skew adaptation circuit 33 updates (n−1) codes excluding one code corresponding to the reference value among the n codes included in the skew calibration code Cs. At this time, the skew adaptation circuit 33 does not update the one code corresponding to the digital value serving as the reference value among the n codes included in the skew calibration code Cs.

In the second type of skew update processing, the skew adaptation circuit 33 first updates the (n−1) codes excluding the one code corresponding to the reference value among the n codes included in the skew calibration code Cs. Then, the skew adaptation circuit 33 further updates the one code corresponding to the digital value serving as the reference value based on the updated (n−1) codes.

The signal X0' is input to the FFE 34. The FFE 34 executes arithmetic processing using a digital value to be calculated and digital values of several symbols before and after the digital value to be calculated for every n digital values included in the signal X0' for one cycle. The FFE 34 generates a signal X1 as a result of the arithmetic processing. That is, the signal X1 is a digital signal similarly to the signals X0 and X0'. The signal X1 for one cycle is a set of n digital values. The FFE 34 outputs the signal X1 to the data comparator 35 and the FFE 36. The signal X1 is further output to the CDR 40.

The signal X1 is input to the data comparator 35. The data comparator 35 determines data encoded by the host device 2 as data A1 based on the signal X1. Specifically, in a case where PAM4 is applied, the data comparator 35 determines 2-bit data for every n digital values included in the signal X1 for one cycle. That is, the data A1 has 2-bit data for every n digital values included in the signal X1 for one cycle. The 2-bit data corresponds to, for example, any of "−3", "−1", "+1", and "+3". The data comparator 35 outputs the data A1 to the CDR 40.

The signal X1 is input to the FFE 36. Note that the signal input to the FFE 36 may be a signal X1' (not illustrated) different from the signal X1 input to the data comparator 35 and the CDR 40. In this case, the signal X1' input to the FFE 36 is generated based on the signal X1. The FFE 36 executes arithmetic processing using a digital value to be calculated and digital values of several symbols before and after the digital value to be calculated for every n digital values included in the signal X1 for one cycle. The arithmetic processing by the FFE 36 may be different from the arithmetic processing by the FFE 34. The FFE 36 generates a signal X2 as a result of the arithmetic processing. That is, the signal X2 is a digital signal similarly to the signals X0, X0', and X1. The signal X2 for one cycle is a set of n digital values. The FFE 36 outputs the signal X2 to the DFE 37.

The signal X2 is input to the DFE 37. The DFE 37 executes arithmetic processing based on a digital value to be calculated and digital values of several symbols before and after the digital value to be calculated for every n digital values included in the signal X2 for one cycle. The DFE 37 generates and outputs a signal Xf as a result of the arithmetic processing. That is, the signal Xf is a digital signal similarly to the signals X0, X0', X1, and X2. The signal Xf for one cycle is a set of n digital values. The signal Xf generated by the DFE 37 is output to the data comparator 38 and a subsequent circuit.

The signal Xf is input to the data comparator 38. The data comparator 38 determines data encoded by the host device 2 as the data Af based on the signal Xf.

Specifically, in a case where PAM4 is applied, the data comparator 38 determines 2-bit data for every n digital values included in the signal Xf for one cycle. The data Af determined by the data comparator 38 is output to a subsequent circuit.

1.6 Clock Data Recovery Circuit

Next, an internal configuration of the clock data recovery circuit (CDR) of the receiver circuit according to the embodiment will be described. FIG. 5 is a block diagram illustrating an example of the configuration of the clock data recovery circuit of the receiver circuit according to the embodiment.

The CDR 40 includes a PD 41, an LF 42, a PLL 43, a PI 44, a skew calibration circuit 45, and a clock generation circuit 46.

The PD 41 is a MM baud rate phase detector (Mueller-Muller Baud-Rate Phase Detector). The MM baud rate phase detector uses one sampling result per symbol when detecting a phase shift related to the signal CLK. Further, the MM baud rate phase detector does not use a sampling result of an edge (boundary) of a pulse corresponding to the data encoded into the signals S0 and /S0 when detecting the phase shift. The signal X1 and the data A1 are input to the PD 41 from the digital processing circuit 30. The PD 41 calculates a value PDOUT based on the signal X1 and the data A1. The value PDOUT is a value corresponding to a phase shift between a current sampling timing by the signal CLK and an optimum sampling timing. The PD 41 outputs the value PDOUT to the LF 42.

The LF 42 is a loop filter. The value PDOUT is input to the LF 42. The LF 42 calculates a value LFOUT based on the value PDOUT. The value LFOUT is a value corresponding to the correction amount of the phase of the signal CLK. The LF 42 outputs the value LFOUT to the PI 44.

The PLL 43 is a phase locked loop circuit. The PLL 43 generates a signal REF. The signal REF is a reference signal having a reference frequency in the receiver circuit. The PLL 43 outputs the signal REF to the PI 44. In the following description, a difference between the reference frequency of the signal REF and the frequency of the clock signal embedded in the signals S0 and /S0 by the host device 2 is also referred to as a "frequency deviation".

The PI 44 is a phase interpolator. The value LFOUT is input from the LF 42 to the PI 44, and the signal REF is input from the PLL 43 to the PI 44. The PI 44 generates a signal PIOUT from the signal REF based on the value LFOUT. The signal PIOUT is an n-phase signal whose phase has been corrected. The PI 44 outputs the signal PIOUT to the skew calibration circuit 45.

The signal PIOUT is input to the skew calibration circuit 45. The skew calibration circuit 45 executes skew calibration processing for each n-phase signal included in the signal PIOUT for one cycle. In the skew calibration processing by the skew calibration circuit 45, the skew calibration code Cs input from the skew adaptation circuit 33 is used. As a result of the skew calibration processing, the skew calibration circuit 45 generates a signal PIOUT' whose phase is adjusted according to the skew calibration code Cs. That is, the signal PIOUT' is an n-phase signal similarly to the signal PIOUT. For example, in a case where the skew calibration code Cs is positive, the skew calibration circuit 45 generates the signal PIOUT' so that the phase shifts in a negative direction. Further, for example, in a case where the skew calibration code Cs is negative, the skew calibration circuit 45 generates the signal PIOUT' so that the phase shifts in a positive direction. The skew calibration circuit 45 outputs the signal PIOUT' to the clock generation circuit 46.

The signal PIOUT' is input to the clock generation circuit 46. The clock generation circuit 46 generates the signal CLK based on the signal PIOUT'. The clock generation circuit 46 uses, for example, a frequency divider circuit to generate the signal CLK. The clock generation circuit 46 outputs the signal CLK to the TI-ADC 20.

1.7 Skew Adaptation Circuit

Next, an internal configuration of the skew adaptation circuit of the digital processing circuit according to the embodiment will be described. Note that, in the following description, the signal X0' of an m-th cycle may be indicated as X0'<m>. Values corresponding to n values X0_1 to X0_n of the signal X0' are indicated as values X0'_1 to X0'_n, respectively. Further, the n codes of the skew calibration codes Cs corresponding to the n values X0'_1 to X0'_n are indicated as n codes Cs_1 to Cs_n, respectively.

Figure 6:
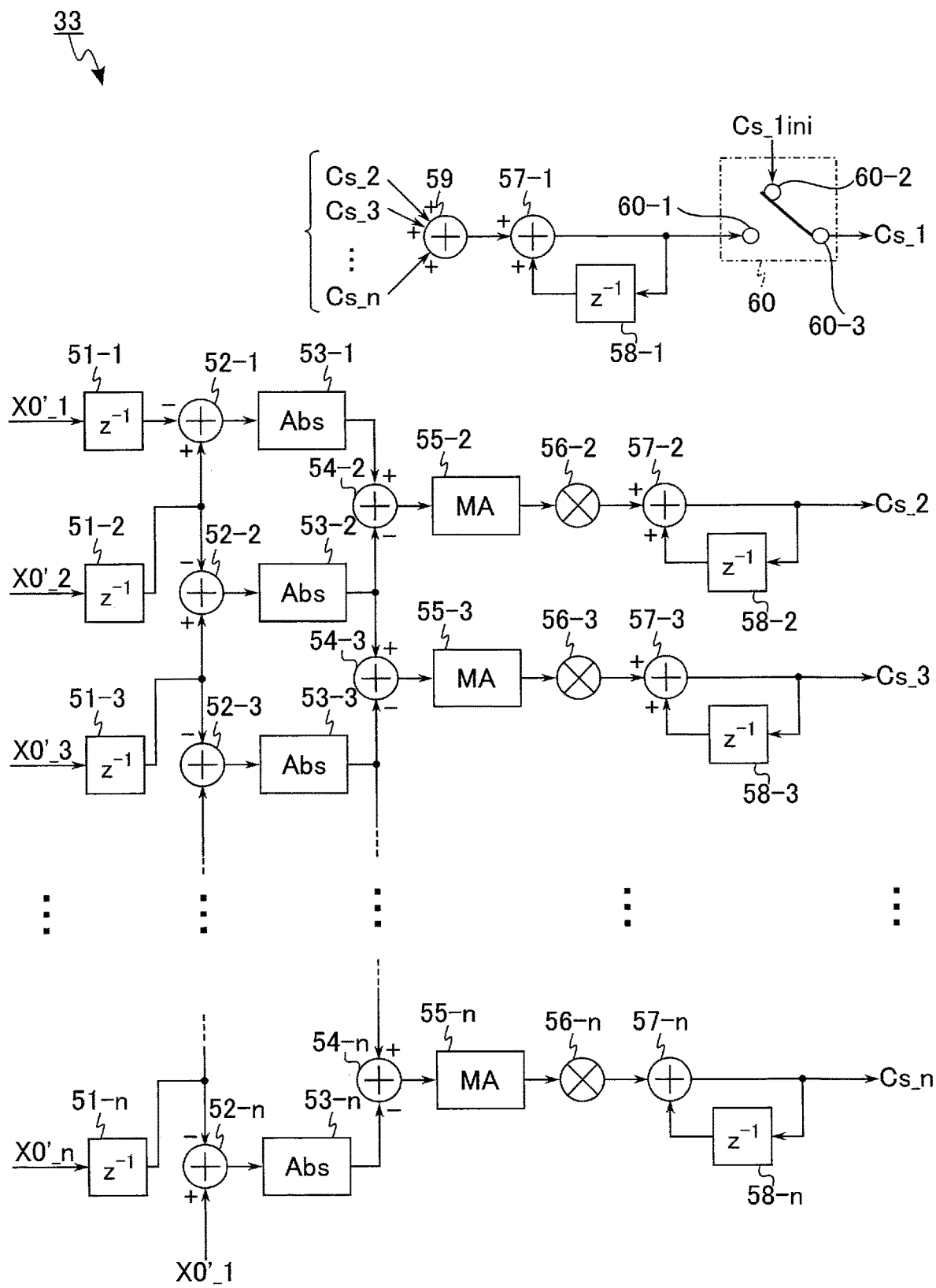
FIG. 6 is a block diagram illustrating an example of a configuration of a skew adaptation circuit of the digital processing circuit according to the embodiment.

FIG. 6 is a block diagram illustrating an example of the configuration of the skew adaptation circuit of the digital processing circuit according to the embodiment. The skew adaptation circuit 33 includes a plurality of delay circuits 51, a plurality of adders 52, a plurality of absolute value conversion circuits 53, a plurality of adders 54, a plurality of moving average calculation circuits 55, a plurality of multipliers 56, a plurality of adders 57, a plurality of delay circuits 58, an adder 59, and a switch 60. The plurality of delay circuits 51 include n delay circuits 51-1, 51-2, 51-3, . . . , and 51-$n$. The plurality of adders 52 include n adders 52-1, 52-2, 52-3, . . . , and 52-$n$. The plurality of absolute value conversion circuits 53 include n absolute value conversion circuits 53-1, 53-2, 53-3, . . . , and 53-$n$. The plurality of adders 54 include (n−1) adders 54-2, 54-3, . . . , and 54-$n$. The plurality of moving average calculation circuits 55 include (n−1) moving average calculation circuits 55-2, 55-3, . . . , and 55-$n$. The plurality of multipliers 56 include (n−1) multipliers 56-2, 56-3, . . . , and 56-$n$. The plurality of adders 57 include n adders 57-1, 57-2, 57-3, . . . , and 57-$n$. The plurality of delay circuits 58 include n delay circuits 58-1, 58-2, 58-3, . . . , and 58-$n$.

The values X0'_1<$m$> to X0'_$n$<$m$> are input to the n delay circuits 51-1 to 51-$n$, respectively. The delay circuits 51-1 to 51-$n$ delay the values X0'_1<$m$> to X0'_$n$<$m$> by, for example, one cycle, and output the delayed values.

The value X0'_1<$m$> output from the delay circuit 51-1 and the value X0'_2<$m$> output from the delay circuit 51-2 are input to the adder 52-1. The adder 52-1 subtracts the value X0'_1<$m$> from the value X0'_2<$m$>. The adder 52-1 outputs a value (X0'_2<$m$>−X0'_1<$m$>) to the absolute value conversion circuit 53-1 as a calculation result.

The value X0'_2<$m$> output from the delay circuit 51-2 and the value X0'_3<$m$> output from the delay circuit 51-3 are input to the adder 52-2. The adder 52-2 subtracts the value X0'_2<$m$> from the value X0'_3<$m$>. The adder 52-2 outputs a value (X0'_3<$m$>−X0'_2<$m$>) to the absolute value conversion circuit 53-2 as a calculation result.

The value X0'_$k$<$m$> output from the delay circuit 51-$k$ and the value X0'_($k$+1)<$m$> output from the delay circuit 51-($k$+1) are input to the adder 52-$k$. The adder 52-$k$ subtracts the value X0'_$k$<$m$> from the value X0'_($k$+1)<m>. The adder 52-$k$ outputs a value (X0'_($k$+1)<$m$>−X0'_$k$<$m$>) to the absolute value conversion circuit 53-$k$ as a calculation result.

The description regarding the adder 52-$k$ holds for all k of 3 or more and (n−1) or less.

The value X0'_$n$<$m$> output from the delay circuit 51-$n$ and the value X0'_1<$m$+1> after being input to the delay circuit 51-1 are input to the adder 52-$n$. The adder 52-$n$ subtracts the value X0'_$n$<$m$> from the value X0'_1<$m$+1>. The adder 52-$n$ outputs a value (X0'_1<$m$+1>−X0'_$n$<$m$>) to the absolute value conversion circuit 53-$n$ as a calculation result.

The output values from the n adders 52-1 to 52-$n$ are input to the n absolute value conversion circuits 53-1 to 53-$n$, respectively. The absolute value conversion circuits 53-1 to 53-$n$ output absolute values of the output values from the adders 52-1 to 52-$n$, respectively.

The output value from the absolute value conversion circuit 53-1 and the output value from the absolute value conversion circuit 53-2 are input to the adder 54-2. The adder 54-2 subtracts the output value from the absolute value conversion circuit 53-2 from the output value from the absolute value conversion circuit 53-1. The adder 54-2 outputs a calculation result to the moving average calculation circuit 55-2.

The output value from the absolute value conversion circuit 53-($k$−1) and the output value from the absolute value conversion circuit 53-$k$ are input to the adder 54-$k$. The adder 54-$k$ subtracts the output value from the absolute value conversion circuit 53-$k$ from the output value from the absolute value conversion circuit 53-($k$−1). The adder 54-$k$ outputs a calculation result to the moving average calculation circuit 55-$k$.

The description regarding the adder 54-$k$ holds for all k of 3 or more and n or less.

The output values from the adders 54-2 to 54-$n$ are input to the moving average calculation circuits 55-2 to 55-$n$, respectively. The moving average calculation circuits 55-2 to 55-$n$ output moving averages of the output values from the adders 54-2 to 54-$n$, respectively.

The output values from the moving average calculation circuits 55-2 to 55-$n$ are input to the multipliers 56-2 to 56-$n$, respectively. Each of the multipliers 56-2 to 56-$n$ outputs a value obtained by multiplying the output value from each of the moving average calculation circuits 55-2 to 55-$n$ by a predetermined multiplier. Note that the predetermined multipliers applied to the multipliers 56-2 to 56-$n$ may be equal to or different from each other.

The output values from the multipliers 56-2 to 56-$n$ and the output values from the delay circuits 58-2 to 58-$n$ are input to the adders 57-2 to 57-$n$, respectively. The adders 57-2 to 57-$n$ add the output values from the multipliers 56-2 to 56-$n$ and the output values from the delay circuits 58-2 to 58-$n$, respectively. The adders 57-2 to 57-$n$ output calculation results to the delay circuits 58-2 to 58-$n$, respectively. The output values from the adders 57-2 to 57-$n$ are further output as codes Cs_2 to Cs_n to the adder 59 and the skew calibration circuit 45 of the CDR 40.

The codes Cs_2 to Cs_n are input to the delay circuits 58-2 to 58-$n$, respectively. The delay circuits 58-2 to 58-$n$ delay the codes Cs_2 to Cs_n by, for example, one cycle, and output the delayed codes Cs_2 to Cs_n to the adders 57-2 to 57-$n$, respectively.

The codes Cs_2 to Cs_n are input to the adder 59. The adder 59 adds the codes Cs_2 to Cs_n. The adder 59 outputs a calculation result to the adder 57-1.

An addition value of the codes Cs_2 to Cs_n by the adder 59 is input to the adder 57-1. The output value from the delay circuit 58-1 is further input to the adder 57-1. The adder 57-1 adds the addition value of the codes Cs_2 to Cs_n by the adder 59 and the output value from the delay circuit 58-1. The adder 57-1 outputs a calculation result to the delay circuit 58-1. The output value from the adder 57-1 is further output to the switch 60.

The output value of the adder 57-1 is input to the delay circuit 58-1. The delay circuit 58-1 delays the output value of the adder 57-1 by, for example, one cycle, and outputs the delayed output value to the adder 57-1.

The switch 60 includes a first input end 60-1, a second input end 60-2, and an output end 60-3. The switch 60 is configured to switch the connection with the output end 60-3 to one of the first input end 60-1 and the second input end 60-2. The output value of the adder 57-1 is input to the first input end 60-1 of the switch 60. An initial value Cs_1ini is input to the second input end 60-2 of the switch 60. The initial value Cs_1ini is, for example, "0". A state (a state illustrated in FIG. 6) in which the second input end 60-2 and the output end 60-3 of the switch 60 are connected corresponds to the first type of skew update processing. A state in which the first input end 60-1 and the output end 60-3 of the switch 60 are connected corresponds to the second type of skew update processing. The switch 60 is, for example, a circuit including a multiplexer or a transistor. An output value from the output end 60-3 of the switch 60 is output as the code Cs_1 to the skew calibration circuit 45 of the CDR 40. That is, the code Cs_1 is fixed to the initial value Cs_1ini in the first type of skew update processing. Then, the code Cs_1 is updated to a value based on the addition value of the codes Cs_2 to Cs_n in the second type of skew update processing.

1.8 Gain Adaptation Circuit

Next, an internal configuration of the gain adaptation circuit of the digital processing circuit according to the embodiment will be described. Note that, in the following description, the n codes of the gain calibration codes Cg corresponding to the n values X0'_1 to X0'_n are indicated as n codes Cg_1 to Cg_n, respectively.

FIG. 7 is a block diagram illustrating an example of the configuration of the gain adaptation circuit of the digital processing circuit according to the embodiment. The gain adaptation circuit 32 includes a plurality of absolute value conversion circuits 61, a plurality of adders 62, a plurality of adders 63, a plurality of delay circuits 64, an adder 65, and a switch 66. The plurality of absolute value conversion circuits 61 include n absolute value conversion circuits 61-1, 61-2, 61-3, . . . , and 61-n. The plurality of adders 62 include (n−1) adders 62-2, 62-3, . . . , and 62-n. The plurality of adders 63 include n adders 63-1, 63-2, 63-3, . . . , and 63-n. The plurality of delay circuits 64 include n delay circuits 64-1, 64-2, 64-3, . . . , and 64-n.

The values X0'_1 to X0'_n are input to the absolute value conversion circuits 61-1 to 61-n, respectively. The absolute value conversion circuits 61-1 to 61-n output absolute values of the values X0'_1 to X0'_n, respectively.

The output value from the absolute value conversion circuit 61-1 and the output value from the absolute value conversion circuit 61-2 are input to the adder 62-2. The adder 62-2 subtracts the output value from the absolute value conversion circuit 61-2 from the output value from the absolute value conversion circuit 61-1. The adder 62-2 outputs a calculation result to the adder 63-2.

The output value from the absolute value conversion circuit 61-1 and the output value from the absolute value conversion circuit 61-k are input to the adder 62-k. The adder 62-k subtracts the output value from the absolute value conversion circuit 61-k from the output value from the absolute value conversion circuit 61-1. The adder 62-k outputs a calculation result to the adder 63-k.

The description regarding the adder 62-k holds for all k of 3 or more and n or less.

The output values from the adders 62-2 to 62-n and the output values from the delay circuits 64-2 to 64-n are input to the adders 63-2 to 63-n, respectively. The adders 63-2 to 63-n add the output values from the adders 62-2 to 62-n and the output values from the delay circuits 64-2 to 64-n, respectively. The adders 63-2 to 63-n output calculation results to the delay circuits 64-2 to 64-n, respectively. The output values from the adders 63-2 to 63-n are further output as codes Cg_2 to Cg_n to the adder 65 and the gain calibration circuit 31 of the digital processing circuit 30.

The codes Cg_2 to Cg_n are input to the delay circuits 64-2 to 64-n, respectively. The delay circuits 64-2 to 64-n delay the codes Cg_2 to Cg_n by, for example, one cycle, and output the delayed codes Cg_2 to Cg_n to the adders 63-2 to 63-n, respectively.

The codes Cg_2 to Cg_n are input to the adder 65. The adder 65 adds the codes Cg_2 to Cg_n. The adder 65 outputs a calculation result to the adder 63-1.

An addition value of the codes Cg_2 to Cg_n by the adder 65 is input to the adder 63-1. The output value from the delay circuit 64-1 is further input to the adder 63-1. The adder 63-1 adds the addition value of the codes Cg_2 to Cg_n by the adder 65 and the output value from the delay circuit 64-1. The adder 63-1 outputs a calculation result to the delay circuit 64-1. The output value from the adder 63-1 is further output to the switch 66.

The output value of the adder 63-1 is input to the delay circuit 64-1. The delay circuit 64-1 delays the output value of the adder 63-1 by, for example, one cycle and outputs the delayed output value to the adder 63-1.

The switch 66 includes a first input end 66-1, a second input end 66-2, and an output end 66-3. The switch 66 is configured to switch the connection with the output end 66-3 to one of the first input end 66-1 and the second input end 66-2. The output value of the adder 63-1 is input to the first input end 66-1 of the switch 66. An initial value Cg_1ini is input to the second input end 66-2 of the switch 66. The initial value Cg_1ini is, for example, "0". A state (a state illustrated in FIG. 7) in which the second input end 66-2 and the output end 66-3 of the switch 66 are connected corresponds to the first type of gain update processing. A state in which the first input end 66-1 and the output end 66-3 of the switch 66 are connected corresponds to the second type of gain update processing. The switch 66 is, for example, a circuit including a multiplexer or a transistor. The output value from the output terminal 66-3 of the switch 66 is output as the code Cg_1 to the gain calibration circuit 31 of the digital processing circuit 30. That is, the code Cg_1 is fixed to the initial value Cg_1ini in the first type of gain update processing. Then, the code Cg_1 is updated to a value based on the addition value of the codes Cg_2 to Cg_n in the second type of gain update processing.

2. Operation

Next, an operation of the receiver device according to the embodiment will be described.

2.1 Receiver Operation Including CDR Loop

Figure 8:
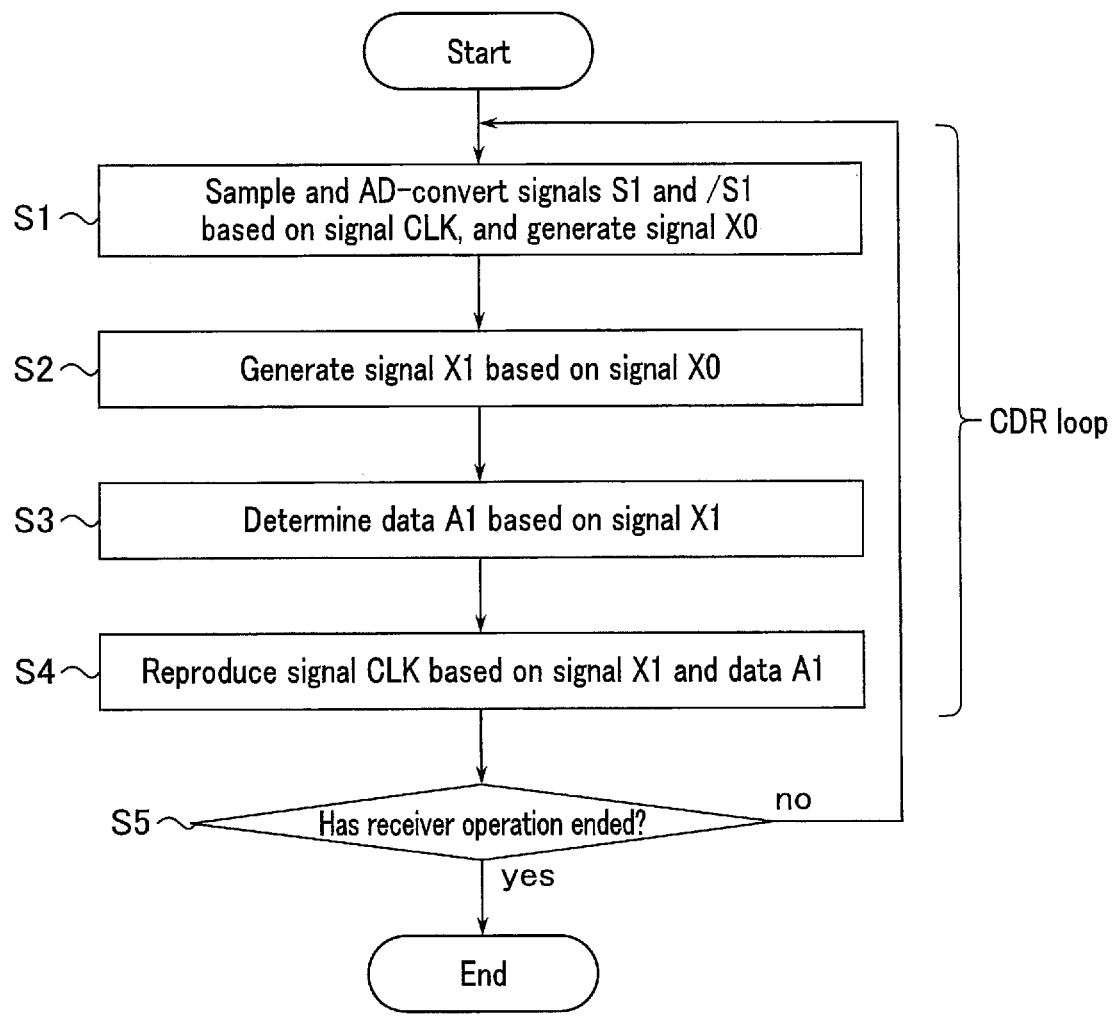
FIG. 8 is a flowchart illustrating an example of a receiver operation including a CDR loop in the receiver device according to the embodiment.

First, a receiver operation including a CDR loop in the receiver device according to the embodiment will be described. FIG. 8 is a flowchart illustrating an example of a receiver operation including a CDR loop in the receiver device according to the embodiment.

When reception of the signals S0 and /S0 is started (start), the TI-ADC 20 samples and AD-converts the signals S1 and /S1 based on the signal CLK, and generates the signal X0 for one cycle (S1). The signals S1 and /S1 are signals generated based on the signals S0 and /S0.

The FFE 34 of the digital processing circuit 30 generates the signal X1 for one cycle based on the signal X0 for one cycle (S2).

The data comparator 35 of the digital processing circuit 30 determines the data A1 for one cycle based on the signal X1 for one cycle (S3).

The CDR 40 recovers the signal CLK based on the signal X1 and the data A1 for one cycle (S4).

The host interface circuit 8 determines whether or not the reception of the signals S0 and /S0 has been ended based on the presence or absence of the input of the signals S1 and /S1 (S5).

In a case where the reception of the signals S0 and /S0 has not been ended (S5; no), the TI-ADC 20 generates the signal X0 of the next cycle based on the recovered signal CLK (S1). As a result, the processes of S1 to S4 are repeated (CDR loop) until the reception of the signals S0 and /S0 is ended.

In a case where the reception of the signals S0 and /S0 has been ended (S5; yes), the receiver operation ends (end).

2.2 Gain Adjustment Operation

Figure 9:
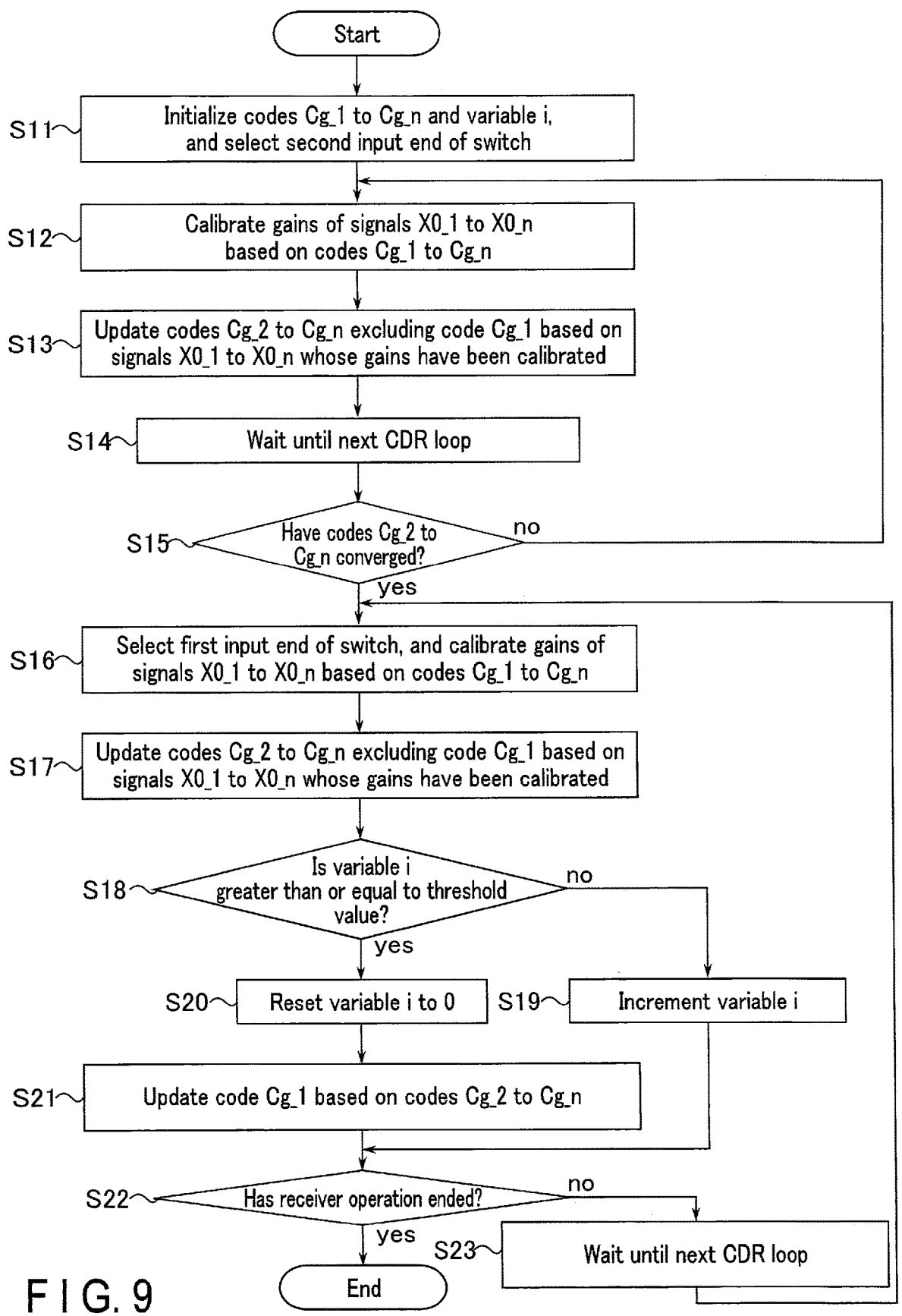
FIG. 9 is a flowchart illustrating an example of a gain adjustment operation in the receiver device according to the embodiment.

Next, a gain adjustment operation according to the embodiment will be described. The gain adjustment operation is an operation including gain calibration processing by the gain calibration circuit 31 and gain update processing by the gain adaptation circuit 32 in the digital processing circuit 30. FIG. 9 is a flowchart illustrating an example of the gain adjustment operation in the receiver device according to the embodiment.

When reception of the signals S0 and /S0 is started (start), the gain adaptation circuit 32 initializes the gain calibration codes Cg_1 to Cg_n and a variable i, and selects the second input end 66-2 of the switch 66 (S11). The variable i is, for example, an integer having an initial value of 0. Accordingly, the initial value Cg_1ini is output from the gain adaptation circuit 32 as the gain calibration code Cg_1 via the second input end 66-2 of the switch 66.

The gain calibration circuit 31 calibrates the gains of the signals X0_1 to X0_$n$ based on the gain calibration codes Cg_1 to Cg_n initialized by the processing of S11 (S12). That is, the gain calibration circuit 31 outputs the signals X0_1 to X0_$n$ (that is, the signals X0'_1 to X0'_$n$) whose gains are calibrated based on the gain calibration codes Cg_1 to Cg_n.

Based on the signals X0_1 to X0_$n$ whose gains have been calibrated by the gain calibration processing in S12, the gain adaptation circuit 32 updates the gain calibration codes Cg_2 to Cg_n excluding the gain calibration code Cg_1 (S13). That is, in the processing of S13, the gain calibration code Cg_1 is not updated from the initial value Cg_1ini.

After the processing of S13, the gain adaptation circuit 32 waits until the next CDR loop (S14).

After the processing of S14, the gain adaptation circuit 32 determines whether or not the gain calibration codes Cg_2 to Cg_n have converged (S15). Whether or not the gain calibration codes Cg_2 to Cg_n have converged is determined by, for example, whether or not update amounts of the gain calibration codes Cg_2 to Cg_n in the processing of S13 can be considered to be sufficiently small.

In a case where it is determined that the gain calibration codes Cg_2 to Cg_n have not converged (S15; no), the gain calibration circuit 31 calibrates the gains of the signals X0_1 to X0_$n$ based on the gain calibration code Cg_1 initialized by the processing of S11 and the gain calibration codes Cg_2 to Cg_n updated by the processing of S13 in the CDR loop one cycle before (S12). Thereafter, the subsequent processing of S13 is executed. As described above, while it is determined that the gain calibration codes Cg_2 to Cg_n have not converged, the gain update processing of not updating the gain calibration code Cg_1 is repeatedly executed.

In a case where it is determined that the gain calibration codes Cg_2 to Cg_n have converged (S15; yes), the gain adaptation circuit 32 selects the first input end 66-1 of the switch 66. Then, the gain calibration circuit 31 calibrates the gains of the signals X0_1 to X0_$n$ based on the gain calibration code Cg_1 initialized in the processing of S11 and the gain calibration codes Cg_2 to Cg_n determined to be converged in the processing of S15 (S16).

Based on the signals X0_1 to X0_$n$ (that is, the signals X0_1 to X0'_$n$) whose gains have been calibrated by the gain calibration processing in S16, the gain adaptation circuit 32 updates the gain calibration codes Cg_2 to Cg_n excluding the gain calibration code Cg_1 (S17). In the processing of S17, the gain calibration code Cg_1 is not updated similarly to the processing of S13.

The gain adaptation circuit 32 determines whether or not the variable i is greater than or equal to a threshold value (S18).

In a case where the variable i is less than the threshold value (S18; no), the gain adaptation circuit 32 increments the variable i (S19).

In a case where the variable i is greater than or equal to the threshold value (S18; yes), the gain adaptation circuit 32 resets the variable i to 0 (S20).

After the processing of S20, the gain adaptation circuit 32 updates the gain calibration code Cg_1 based on the gain calibration codes Cg_2 to Cg_n updated by the processing of S17 (S21).

After the processing of S19 or the processing of S21, the host interface circuit 8 determines whether or not the reception of the signals S0 and /S0 has been ended based on the presence or absence of the input of the signals S1 and /S1 (S22).

In a case where the reception of the signals S0 and /S0 has not been ended (S22; no), the gain adaptation circuit 32 waits until the next CDR loop (S23).

After the processing of S23, the gain calibration circuit 31 calibrates the gains of the signals X0_1 to X0_$n$ based on the gain calibration code Cg_1 updated in the processing of S21 in the CDR loop one cycle before or whose update is postponed by the processing of S18, and the gain calibration codes Cg_2 to Cg_n updated in the processing of S17 in the CDR loop one cycle before (S16). Then, the subsequent processes of S17 to S22 are executed.

As described above, after the convergence of the gain calibration codes Cg_2 to Cg_n, the update of the gain calibration code Cg_1 is postponed until the variable i becomes greater than or equal to the threshold value. Then, the gain calibration code Cg_1 is updated in a cycle (that is, a cycle longer than the update cycle of the gain calibration codes Cg_2 to Cg_n) in which the variable i is greater than or equal to the threshold value. Then, the gain update processing of the gain calibration code Cg_1 and the gain update processing of the gain calibration codes Cg_2 to Cg_n are repeatedly updated in different cycles until the reception of the signals S0 and /S0 is ended.

In a case where the reception of the signals S0 and /S0 has been ended (S22; yes), the gain adjustment operation ends (end).

2.3 Skew Adjustment Operation

Figure 10:
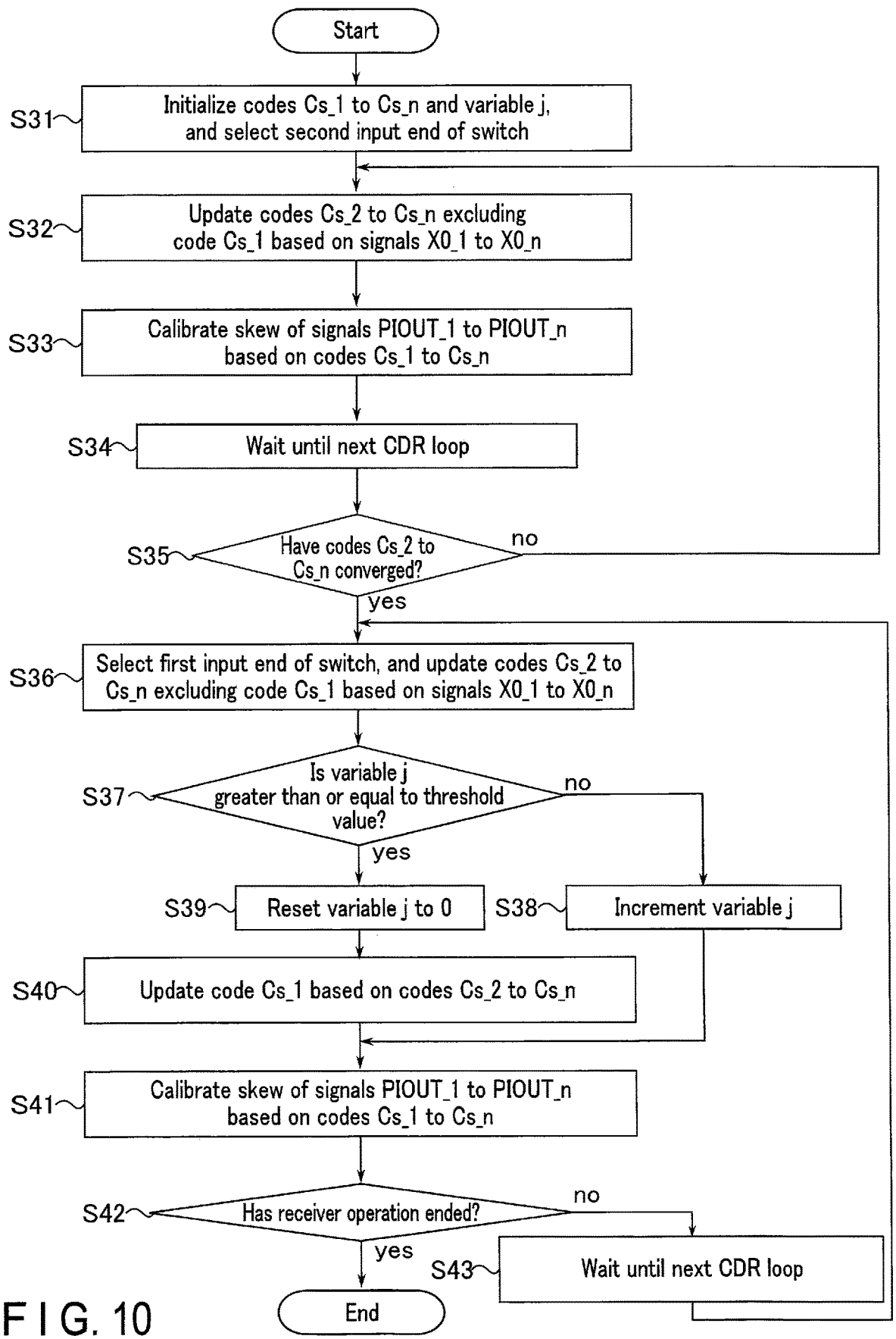
FIG. 10 is a flowchart illustrating an example of a skew adjustment operation in the receiver device according to the embodiment.

Next, a skew adjustment operation according to the embodiment will be described. The skew adjustment operation includes skew calibration processing by the skew calibration circuit 45 of the CDR 40 and skew update processing by the skew adaptation circuit 33 of the digital processing circuit 30. FIG. 10 is a flowchart illustrating an example of the skew adjustment operation in the receiver device according to the embodiment.

When reception of the signals S0 and /S0 is started (start), the skew adaptation circuit 33 initializes the skew calibration codes Cs_1 to Cs_n and a variable j, and selects the second input end 60-2 of the switch 60 (S31). The variable j is, for example, an integer having an initial value of 0. Accordingly, the initial value Cs_1ini is output from the skew adaptation circuit 33 as the skew calibration code Cs_1 via the second input end 60-2 of the switch 60.

Based on the signals X0_1 to X0_$n$ output from the TI-ADC 20, the skew adaptation circuit 33 updates the skew calibration codes Cs_2 to Cs_n excluding the skew calibration code Cs_1 (S32). That is, in the processing of S32, the skew calibration code Cs_1 is not updated from the initial value Cs_1ini.

After the processing of S32, the skew calibration circuit 45 calibrates the skew of the signals PIOUT_1 to PIOUT_n based on the skew calibration code Cs_1 initialized by the processing of S31 and the skew calibration codes Cs_2 to Cs_n updated by the processing of S32 (S33).

After the processing of S33, the skew adaptation circuit 33 waits until the next CDR loop (S34).

After the processing of S34, the skew adaptation circuit 33 determines whether or not the skew calibration codes Cs_2 to Cs_n have converged (S35). Whether or not the skew calibration codes Cs_2 to Cs_n have converged is determined by, for example, whether or not update amounts of the skew calibration codes Cs_2 to Cs_n in the processing of S32 can be considered to be sufficiently small.

In a case where it is determined that the skew calibration codes Cs_2 to Cs_n have not converged (S35; no), the skew adaptation circuit 33 updates the skew calibration codes Cs_2 to Cs_n excluding the skew calibration code Cs_1 based on the signals X0_1 to X0_n output based on the signal CLK in which the skew has been calibrated by the processing of S33 one cycle before (S32). Thereafter, the subsequent processing of S33 is executed. As described above, while it is determined that the skew calibration codes Cs_2 to Cs_n have not converged, the skew update processing of not updating the skew calibration code Cs_1 is repeatedly executed.

In a case where it is determined that the skew calibration codes Cs_2 to Cs_n have converged (S35; yes), the skew adaptation circuit 33 selects the first input end 60-1 of the switch 60. Then, the skew adaptation circuit 33 updates the skew calibration codes Cs_2 to Cs_n excluding the skew calibration code Cs_1 based on the signals X0_1 to X0_n output based on the skew calibration code Cs_1 initialized in the processing of S31 and the skew calibration codes Cs_2 to Cs_n determined to have converged in the processing of S35 (S36). In the processing of S36, the skew calibration code Cs_1 is not updated similarly to the processing of S32.

The skew adaptation circuit 33 determines whether or not the variable j is greater than or equal to a threshold value (S37).

In a case where the variable j is less than the threshold value (S37; no), the skew adaptation circuit 33 increments the variable j (S38).

In a case where the variable j is greater than or equal to the threshold value (S37; yes), the skew adaptation circuit 33 resets the variable j to 0 (S39).

After the processing of S39, the skew adaptation circuit 33 updates the skew calibration code Cs_1 based on the skew calibration codes Cs_2 to Cs_n updated by the processing of S36 (S40).

After the processing of S38 or the processing of S40, the skew calibration circuit 45 calibrates the skew of the signals PIOUT_1 to PIOUT_n based on the skew calibration codes Cs_1 to Cs_n (S41).

After the processing of S41, the host interface circuit 8 determines whether or not the reception of the signals S0 and /S0 has been ended based on the presence or absence of the input of the signals S1 and /S1 (S42).

In a case where the reception of the signals S0 and /S0 has not been ended (S42; no), the skew adaptation circuit 33 waits until the next CDR loop (S43).

After the processing of S43, the skew adaptation circuit 33 updates the skew calibration codes Cs_2 to Cs_n based on the signals X0_1 to X0_n output based on the signal CLK calibrated in the skew calibration processing of S41 in the CDR loop one cycle before (S36). Then, the subsequent processes of S37 to S42 are executed.

As described above, after the convergence of the skew calibration codes Cs_2 to Cs_n, the update of the skew calibration code Cs_1 is postponed until the variable j becomes greater than or equal to the threshold value. Then, the skew calibration code Cs_1 is updated in a cycle (that is, a cycle longer than the update cycle of the skew calibration codes Cs_2 to Cs_n) in which the variable j is greater than or equal to the threshold value. Then, the skew update processing of the skew calibration code Cs_1 and the skew update processing of the skew calibration codes Cs_2 to Cs_n are repeatedly updated in different cycles until the reception of the signals S0 and /S0 is ended.

In a case where the reception of the signals S0 and /S0 has been completed (S42; yes), the skew adjustment operation ends (end).

3. Effects According to Embodiment

According to the embodiment, the gain adaptation circuit 32 generates the gain calibration codes Cg_2 to Cg_n based on the values X0_1 to X0_n. The gain adaptation circuit 32 generates the gain calibration code Cg_1 based on the sum of the generated gain calibration codes Cg_2 to Cg_n. As a result, it is possible to adjust gain errors included in all of the n ADCs 21-1 to 21-n. Further, the skew adaptation circuit 33 generates the skew calibration codes Cs_2 to Cs_n based on the values X0_1 to X0_n. The skew adaptation circuit 33 generates the skew calibration code Cs_1 based on the sum of the generated skew calibration codes Cs_2 to Cs_n. As a result, it is possible to adjust phase errors included in all of the n ADCs 21-1 to 21-n.

To supplement, the n ADCs 21-1 to 21-n each have different gain errors and different phase errors. On the other hand, these errors can be calculated as a relative amount based on a certain ADC (for example, ADC 21-1). Therefore, in a case where the gain and the skew of a certain ADC are fixed as reference values, adjustment ranges of the gain calibration codes Cg_2 to Cg_n and the skew calibration codes Cs_2 to Cs_n are set to ranges including the errors of the initial values Cg_1ini and Cs_1ini, respectively. That is, in a case where the gain and the phase of a certain ADC are fixed as the reference values, the adjustment ranges of the gain calibration codes Cg_2 to Cg_n and the skew calibration codes Cs_2 to Cs_n are set to be excessively large, which is not preferable.

According to the present embodiment, the gain adaptation circuit 32 generates the gain calibration code Cg_1 based on the sum of the generated gain calibration codes Cg_2 to Cg_n. As a result, a part of the gain error included in the ADC 21-1 can be absorbed as an update amount of the gain calibration code Cg_1. Therefore, the influence of the gain error included in the ADC 21-1 on the update amount of the gain calibration codes Cg_2 to Cg_n can be reduced. Further, the skew adaptation circuit 33 generates the skew calibration code Cs_1 based on the sum of the generated skew calibration codes Cs_2 to Cs_n. As a result, a part of the phase error included in the ADC 21-1 can be absorbed as an update amount of the skew calibration code Cs_1. Therefore, it is possible to reduce the influence of the phase error included in the ADC 21-1 on the update amount of the skew calibration codes Cs_2 to Cs_n.

Furthermore, the gain adaptation circuit 32 starts updating the gain calibration code Cg_1 after it is determined that the gain calibration codes Cg_2 to Cg_n have converged. After it is determined that the skew calibration codes Cs_2 to Cs_n have converged, the skew adaptation circuit 33 starts updating the skew calibration code Cs_1. As a result, after a relative value of the error between the ADC 21-1 and the other ADCs 21-2 to 21-n is substantially determined, an absolute value of the error of the ADC 21-1 can be estimated. Therefore, in the gain update processing and the skew update processing, it is possible to suppress divergence of the updated values of the gain calibration code Cg_1 and the skew calibration code Cs_1.

4. Modifications

Note that the embodiment is not limited to the above-described example, and various modifications can be applied.

In the above-described embodiment, the host interface circuit 8 has been described as an example of the receiver circuit, but the present invention is not limited thereto. For example, the receiver circuit may be any semiconductor integrated circuit used for serial communication.

Further, in the above-described embodiment, the gain adjustment operation and the skew adjustment operation have been described as operations independent of each other, but the present invention is not limited thereto. For example, the gain adjustment operation and the skew adjustment operation can be executed in parallel.

Furthermore, in the embodiment described above, the case where it is determined whether or not to update the gain calibration code Cg_1 based on whether or not the variable i is greater than or equal to the threshold value in the processes of S18 to S21 of the gain adjustment operation has been described, but the present invention is not limited thereto. For example, the gain adaptation circuit 32 may determine whether or not to update the gain calibration code Cg_1 based on whether or not the update amounts of the gain calibration codes Cg_2 to Cg_n have converged.

Furthermore, in the embodiment described above, the case where it is determined whether or not to update the skew calibration code Cs_1 based on whether or not the variable j is greater than or equal to the threshold value in the processes of S37 to S40 of the skew adjustment operation has been described, but the present invention is not limited thereto. For example, the skew adaptation circuit 33 may determine whether or not to update the skew calibration code Cs_1 based on whether or not the update amounts of the skew calibration codes Cs_2 to Cs_n have converged.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor integrated circuit comprising:
a first converter configured to sample an analog signal and convert the sampled analog signal to a first digital value based on a first clock signal;
a second converter configured to sample the analog signal and convert the sampled analog signal to a second digital value based on a second clock signal shifted a first phase from the first clock signal; and
an adjustment circuit configured to adjust at least one of a gain of each of the first digital value and the second digital value and a phase of each of the first clock signal and the second clock signal based on the first digital value and the second digital value, wherein the adjustment circuit includes:
a first circuit configured to update a first code based on the first digital value and the second digital value, and update a second code based on the first code; and
a second circuit configured to calibrate a gain of the first digital value based on the first code, and calibrate a gain of the second digital value based on the second code,
or
a third circuit configured to update a third code based on the first digital value and the second digital value, and update a fourth code based on the third code; and
a fourth circuit configured to calibrate a phase of the first clock signal based on the third code, and calibrate a phase of the second clock signal based on the fourth code.

2. The semiconductor integrated circuit according to claim 1, further comprising
a third converter configured to sample the analog signal and convert the sampled analog signal to a third digital value based on a third clock signal shifted a second phase from the first clock signal,
wherein the adjustment circuit is configured to adjust at least one of a gain of each of the first digital value, the second digital value, and the third digital value and a phase of each of the first clock signal, the second clock signal, and the third clock signal based on the first digital value, the second digital value, and the third digital value.

3. The semiconductor integrated circuit according to claim 2, wherein
the first circuit is configured to update the first code and a fifth code based on the first digital value, the second digital value, and the third digital value, and update the second code based on a sum of the first code and the fifth code; and
the second circuit is configured to calibrate the gain of the first digital value based on the first code, calibrate the gain of the second digital value based on the second code, and calibrate a gain of the third digital value based on the fifth code.

4. The semiconductor integrated circuit according to claim 2, wherein
the third circuit is configured to update the third code and a sixth code based on the first digital value, the second digital value, and the third digital value, and update the fourth code based on a sum of the third code and the sixth code; and
the fourth circuit is configured to calibrate the phase of the first clock signal based on the third code, calibrate the phase of the second clock signal based on the fourth code, and calibrate a phase of the third clock signal based on the sixth code.

5. The semiconductor integrated circuit according to claim 1, wherein
the first circuit is configured to update the second code based on the first code in a case where a condition is satisfied, and stop updating the second code in a case where the condition is not satisfied.

6. The semiconductor integrated circuit according to claim 5, wherein
the condition includes that an update amount of the first code is less than or equal to a threshold value.

7. The semiconductor integrated circuit according to claim 1, wherein
the third circuit is configured to update the fourth code based on the third code in a case where a condition is satisfied, and stop updating the fourth code in a case where the condition is not satisfied.

8. The semiconductor integrated circuit according to claim 7, wherein
the condition includes that an update amount of the third code is less than or equal to a threshold value.

9. A receiver device comprising:
a semiconductor integrated circuit according to claim 1; and
a control circuit configured to control processing of a signal output from the semiconductor integrated circuit.

10. The receiver device according to claim 9, wherein
the semiconductor integrated circuit further comprises
a third converter configured to sample the analog signal and convert the sampled analog signal to a third digital value based on a third clock signal shifted a second phase from the first clock signal, and
the adjustment circuit is configured to adjust at least one of a gain of each of the first digital value, the second digital value, and the third digital value and a phase of each of the first clock signal, the second clock signal, and the third clock signal based on the first digital value, the second digital value, and the third digital value.

11. The receiver device according to claim 10, wherein
the first circuit is configured to update the first code and a fifth code based on the first digital value, the second digital value, and the third digital value, and update the second code based on a sum of the first code and the fifth code; and
the second circuit is configured to calibrate the gain of the first digital value based on the first code, calibrate the gain of the second digital value based on the second code, and calibrate a gain of the third digital value based on the fifth code.

12. The receiver device according to claim 10, wherein
the third circuit is configured to update the third code and a sixth code based on the first digital value, the second digital value, and the third digital value, and update the fourth code based on a sum of the third code and the sixth code; and
the fourth circuit is configured to calibrate the phase of the first clock signal based on the third code, calibrate the phase of the second clock signal based on the fourth code, and calibrate a phase of the third clock signal based on the sixth code.

13. The receiver device according to claim 9, wherein
the first circuit is configured to update the second code based on the first code in a case where a condition is satisfied, and stop updating the second code in a case where the condition is not satisfied.

14. The receiver device according to claim 13, wherein
the condition includes that an update amount of the first code is less than or equal to a threshold value.

15. The receiver device according to claim 9, wherein
the third circuit is configured to update the fourth code based on the third code in a case where a condition is satisfied, and stop updating the fourth code in a case where the condition is not satisfied.

16. The receiver device according to claim 15, wherein
the condition includes that an update amount of the third code is less than or equal to a threshold value.

17. A reception method comprising:
sampling an analog signal and converting the sampled analog signal to a first digital value based on a first clock signal;
sampling the analog signal and converting the sampled analog signal to a second digital value based on a second clock signal shifted a first phase from the first clock signal; and
adjusting at least one of a gain of each of the first digital value and the second digital value and a phase of each of the first clock signal and the second clock signal based on the first digital value and the second digital value, wherein
the adjusting includes:
  updating a first code based on the first digital value and the second digital value, and updating a second code based on the first code; and
  calibrating a gain of the first digital value based on the first code, and calibrating a gain of the second digital value based on the second code,
or
  updating a third code based on the first digital value and the second digital value, and updating a fourth code based on the third code; and
  calibrating a phase of the first clock signal based on the third code, and calibrating a phase of the second clock signal based on the fourth code.

18. The reception method according to claim 17, wherein
the updating the second code includes updating the second code based on the first code in a case where a condition is satisfied, and stopping updating the second code in a case where the condition is not satisfied.

19. The reception method according to claim 15, wherein
the updating the fourth code includes updating the fourth code based on the third code in a case where a condition is satisfied, and stopping updating the fourth code in a case where the condition is not satisfied.

20. The reception method according to claim 17, further comprising:
sampling the analog signal and converting the sampled analog signal to a third digital value based on a third clock signal shifted a second phase from the first clock signal, wherein
the adjusting includes adjusting at least one of a gain of each of the first digital value, the second digital value, and the third digital value and a phase of each of the first clock signal, the second clock signal, and the third clock signal based on the first digital value, the second digital value, and the third digital value.

* * * * *